United States Patent
Belke et al.

(10) Patent No.: US 6,584,682 B2
(45) Date of Patent: Jul. 1, 2003

(54) METHOD FOR MAKING CIRCUIT BOARD

(75) Inventors: Robert Edward Belke, West Bloomfield, MI (US); Thomas Bernd Krautheim, Belleville, MI (US); Vivek Amir Jairazbhoy, Farmington Hills, MI (US); Delin Li, San Jose, CA (US)

(73) Assignee: Visteon Global Tech., Inc., Dearborn, MI (US)

( * ) Notice: Subject to any disclaimer, the term of this patent is extended or adjusted under 35 U.S.C. 154(b) by 0 days.

(21) Appl. No.: 09/812,345

(22) Filed: Mar. 20, 2001

(65) Prior Publication Data
US 2002/0020552 A1 Feb. 21, 2002

Related U.S. Application Data
(60) Provisional application No. 60/207,647, filed on May 26, 2000.

(51) Int. Cl.[7] .................................................. H05K 3/20
(52) U.S. Cl. .............................. 29/831; 29/846; 29/852
(58) Field of Search ........................ 29/830, 831, 832, 29/840, 852

(56) References Cited

U.S. PATENT DOCUMENTS

| | | | |
|---|---|---|---|
| 3,801,388 A | | 4/1974 | Akiyama et al. |
| 4,404,059 A | | 9/1983 | Livshits et al. |
| 4,710,854 A | * | 12/1987 | Yamada et al. ............. 361/414 |
| 4,882,454 A | * | 11/1989 | Peterson et al. ............. 29/846 |
| 5,347,712 A | * | 9/1994 | Yasuda et al. ................ 29/852 |
| 5,451,721 A | * | 9/1995 | Tsukada et al. ............. 174/261 |
| 5,638,598 A | * | 6/1997 | Nakao et al. ................. 29/852 |
| 5,719,354 A | * | 2/1998 | Jester et al. ................. 174/255 |
| 5,738,797 A | | 4/1998 | Belke, Jr. et al. |
| 6,026,564 A | * | 2/2000 | Wang et al. .................. 29/830 |
| 6,037,044 A | * | 3/2000 | Giri et al. ................... 428/209 |
| 6,090,468 A | * | 7/2000 | Shimada et al. ............. 428/137 |
| 6,326,555 B1 | * | 12/2001 | McCormack et al. ....... 174/255 |

* cited by examiner

Primary Examiner—Carl J. Arbes
(74) Attorney, Agent, or Firm—Visteon Global Tech., Inc.

(57) ABSTRACT

A method 10 for making multi-layer electronic circuit boards 148, 248 having aperture 146, 246 which may be selectively connected to an electrical ground potential.

12 Claims, 13 Drawing Sheets

US 6,584,682 B2

METHOD FOR MAKING CIRCUIT BOARD

This application claims the benefit of U.S. Provisional Application Ser. No. 60/207,647, filed May 26, 2000.

FIELD OF THE INVENTION

The present invention relates to an electrical circuit board and a method for making an electrical circuit board and, more particularly, to a method for making a multi-layer electrical circuit board having apertures which are formed through the board and/or through various portions of the board, and which may be selectively connected and/or detached and/or isolated from an electrical ground plane and/or from a source of an electrical ground potential.

BACKGROUND OF THE INVENTION

Multi-layer circuit boards contain and/or include electrical components which selectively and operatively populate opposed top and bottom surfaces of each board (or other respective interior portions of each of the boards), thereby desirably allowing each of the electrical circuit boards to contain and/or include a relatively large amount of electrical components which efficiently and densely populate the respective boards.

It is desirable to allow for communication by and between and/or interconnection of the component containing surfaces and/or portions of an electrical circuit board, thereby allowing the contained electrical components on each side of the board (or within certain interior portions of the board) to cooperatively and selectively interconnect to form one or more desired electrical circuits. This communication and interconnection may require the use of shared electrical ground planes, the transmittal of electrical power and/or control type signals between each of the component containing surfaces and/or the component containing board portions, and/or the selective and physical connection of some or all of the various contained components.

This desired interconnection typically requires that one or more holes be drilled through each of the circuit boards, thereby creating at least one "through hole" or "via" lying and/or traversing between some or all of the opposed component containing surfaces, and through some or all of the various component containing interior circuit board portions. Such drilling is undesirable since it is relatively time consuming, costly, potentially causes damage to significant numbers of the formed electrical circuit boards requiring these circuit boards to be destroyed, and requires costly and inefficient electroless and/or electrolytic plating of the formed holes or "vias".

While some attempts have been made to obviate the need for such plating, such as by the use of a conductive epoxy within each of the drilled holes, these attempts have not produced reliable electrical interconnections and these produced interconnections are not typically adapted to allow for communication of electrical power signals by and between the board surfaces and/or by and between the board surfaces and the interior component containing portions.

There is therefore a need to provide a method for producing a multi-layer electrical circuit board which overcomes some or all of the previously delineated drawbacks and which selectively allows grounded and non-ground "vias" to be desirably and selectively formed.

SUMMARY OF THE INVENTION

It is a first object of the present invention to provide a method for producing a multi-layer electrical circuit board which overcomes some or all of the previously delineated drawbacks of prior multi-layer electrical circuit board forming methodologies and techniques.

It is a second object of the invention to provide a method for producing a multi-layer electrical circuit board which overcomes some or all of the previously delineated drawbacks of prior multi-layer electrical circuit board forming methodologies and techniques and which allows for the selective, efficient, and reliable formation of metalized apertures which allows for communication by and between some or all of the various component containing surfaces and portions of the formed multi-layer electrical circuit board, which selectively allows components contained within and/or upon these portions and surfaces to be interconnected, and which is further adapted to selectively and communicatively receive an electrical component.

It is a third object of the invention to provide a method for producing a multi-layer electrical circuit board which overcomes some or all of the previously delineated drawbacks of prior multi-layer electrical circuit board forming methodologies and techniques and which allows for the selective formation of apertures which may be selectively connected or disconnected and/or isolated from a selectively formed electrical ground plane or bus.

According to a first aspect of the present invention a method for making a multi-layer electrical circuit board is provided. The method process includes the steps of providing a core member having a first surface and a second surface; attaching a certain first material upon the first surface and upon the second surface, effective to form a first pre-circuit assembly; forming a first aperture within the first pre-circuit assembly; providing a first metal member having a first and a second surface and a second metal member having a first and a second surface; attaching a certain second material to the second surface of the first metal member and to the first surface of the second metal member; applying a certain liner material to the certain second material residing upon the first and second metal members; forming a second aperture through the first and second metal members, the certain second material, and through the certain liner material; removing the certain liner material from the certain second material; aligning the second aperture with the first aperture; selectively attaching the certain second material to the certain first material upon the first pre-circuit assembly; selectively removing the certain first and second metal members, effective to form a second pre-circuit assembly; providing third and fourth pre-circuit assemblies; attaching the third and fourth pre-circuit assemblies to the second pre-circuit assembly; and removing certain portions of the third and fourth pre-circuit assemblies, effective to form a third and fourth aperture which are respectively aligned with the first and second aperture, effective to form a circuit board having at least one aperture.

According to a second aspect of the invention,

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1A:
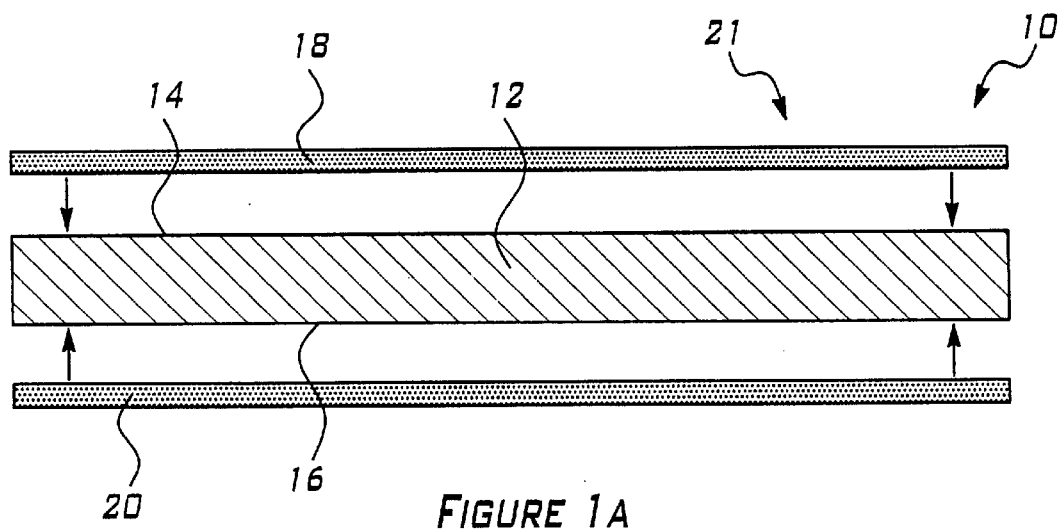
FIGS. 1(a)–(q) are successive sectional side views of a multi-layer circuit board being produced and/or formed in accordance with the teachings of the preferred embodiment of the invention.
Figure 1B:
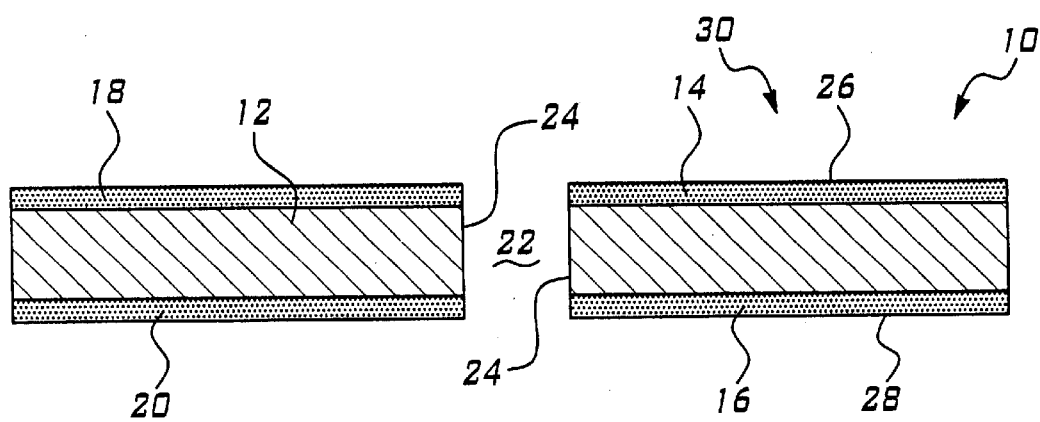
Figure 1C:
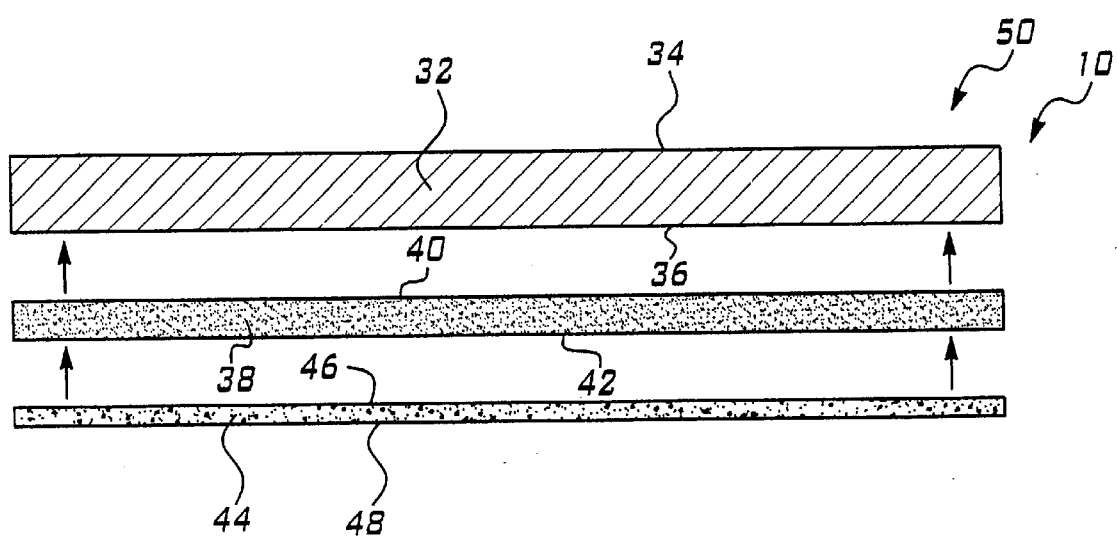
Figure 1D:
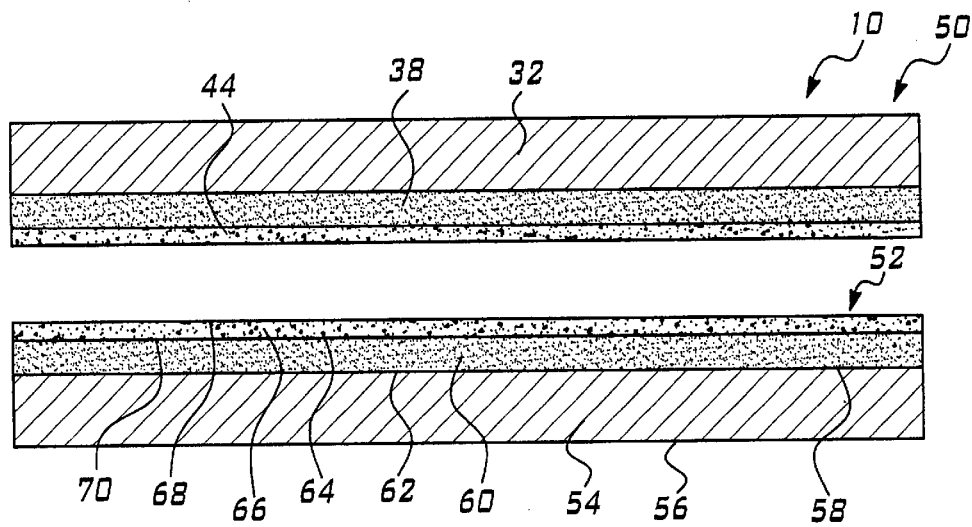
Figure 1E:
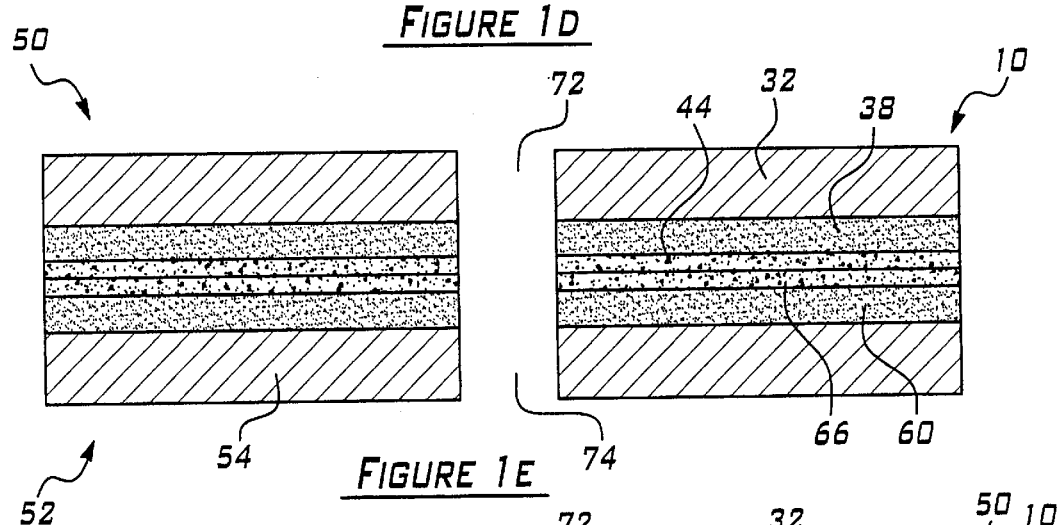
Figure 1F:
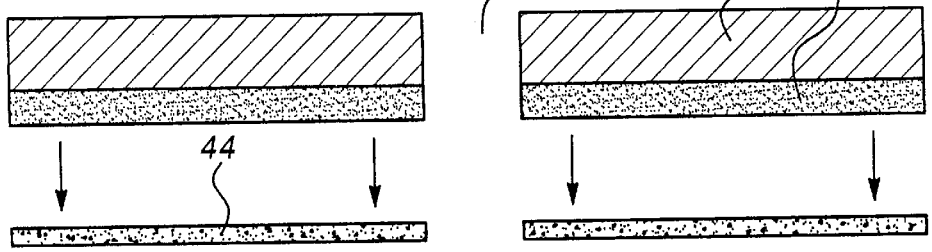
Figure 1F:
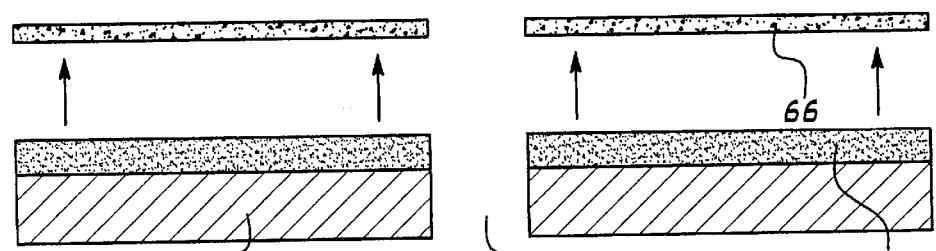
Figure 1G:
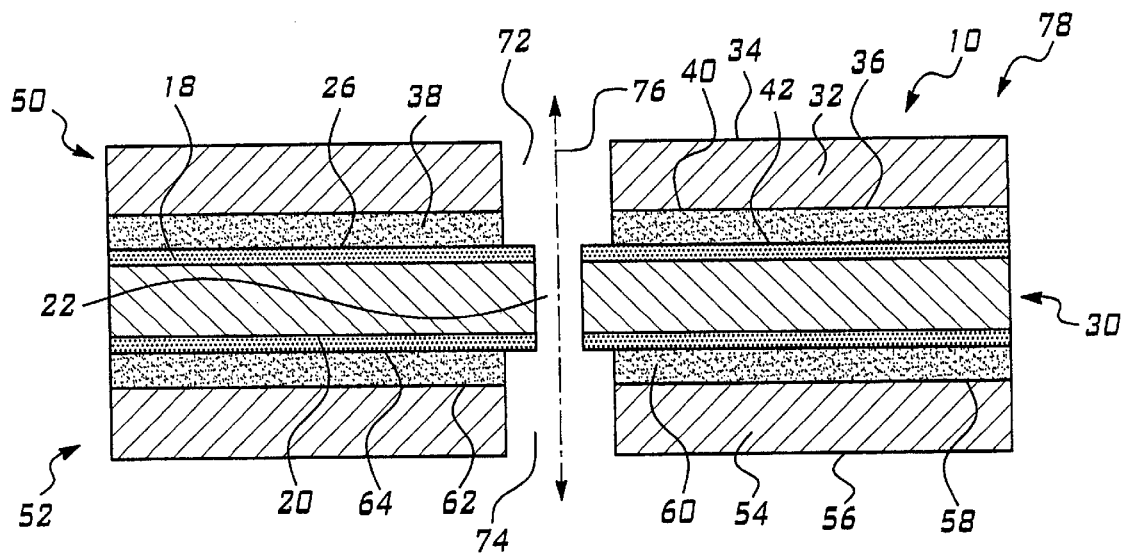
Figure 1H:
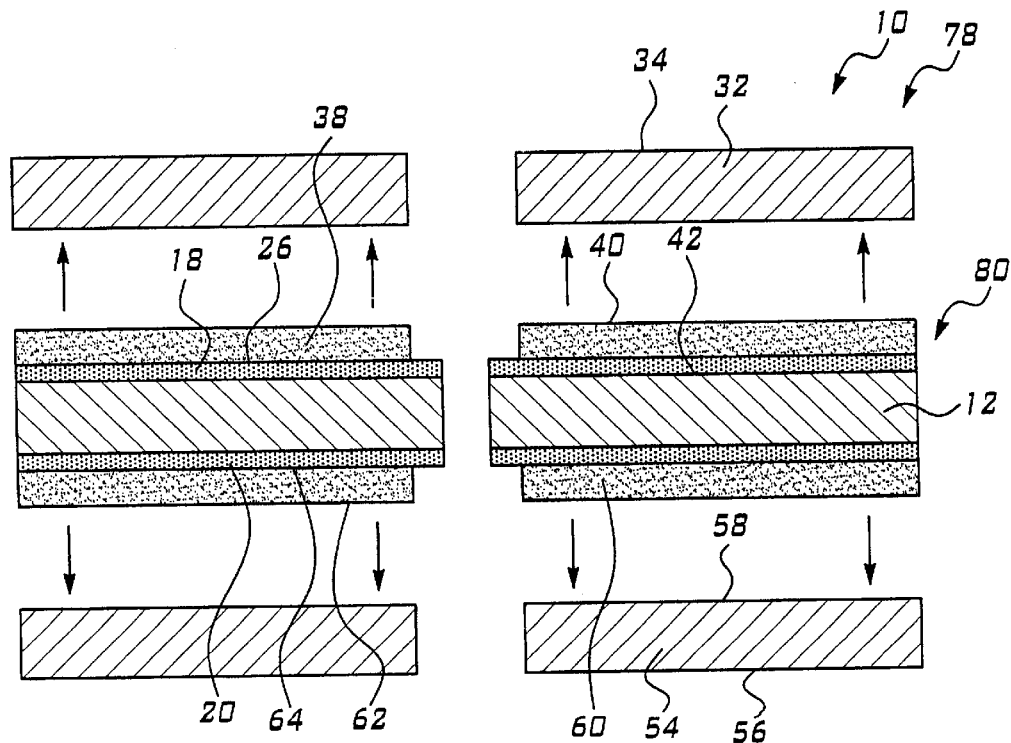
Figure 1I:
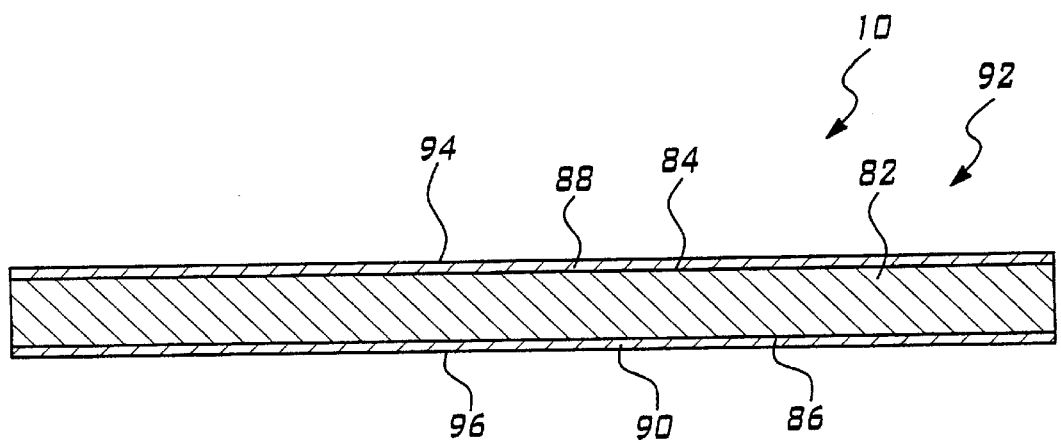
Figure 1J:
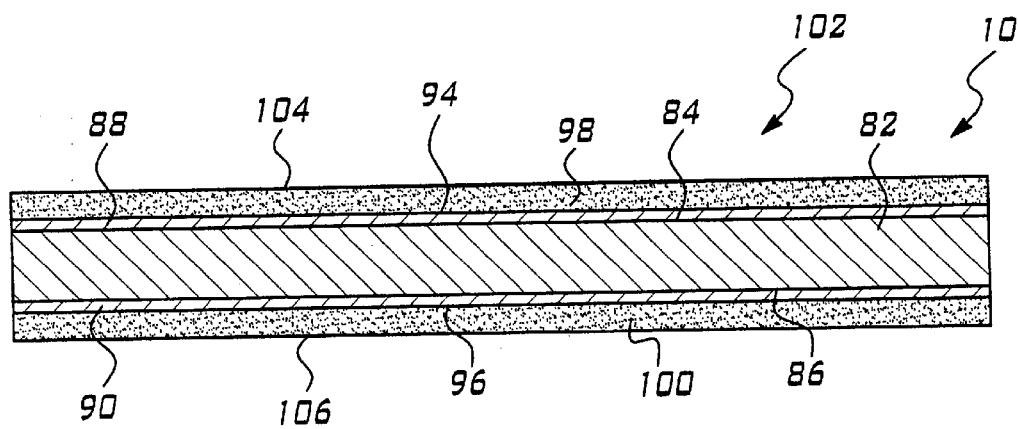
Figure 1K:
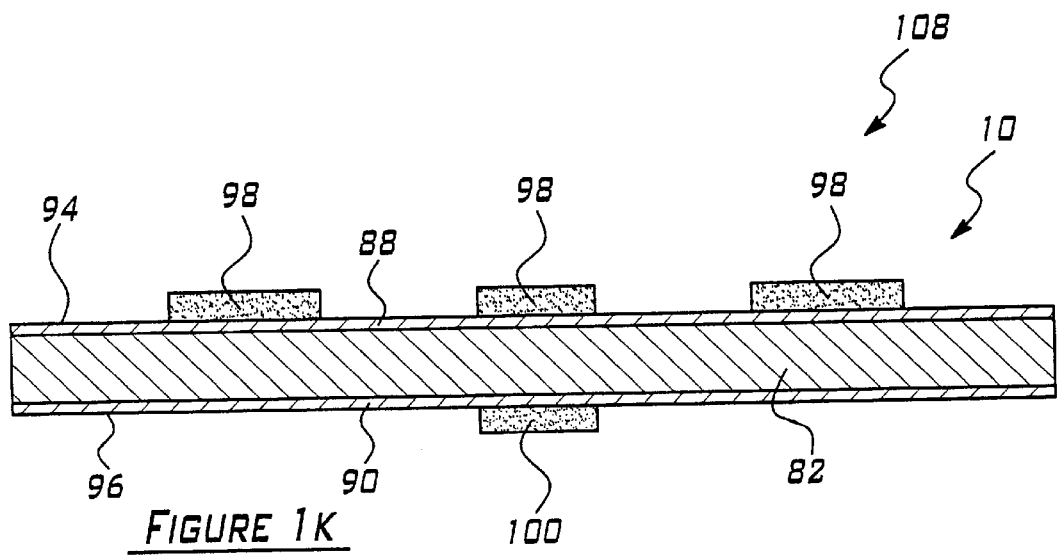
Figure 1L:
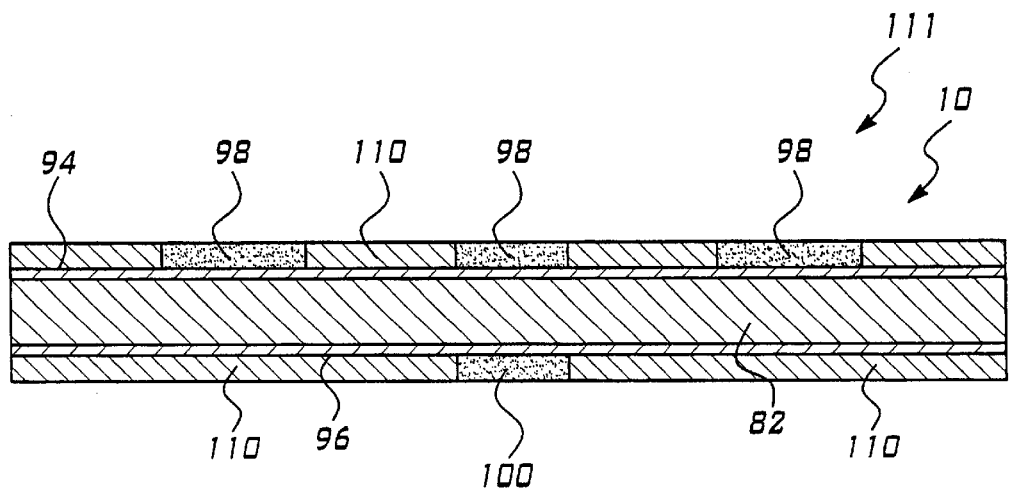
Figure 1M:
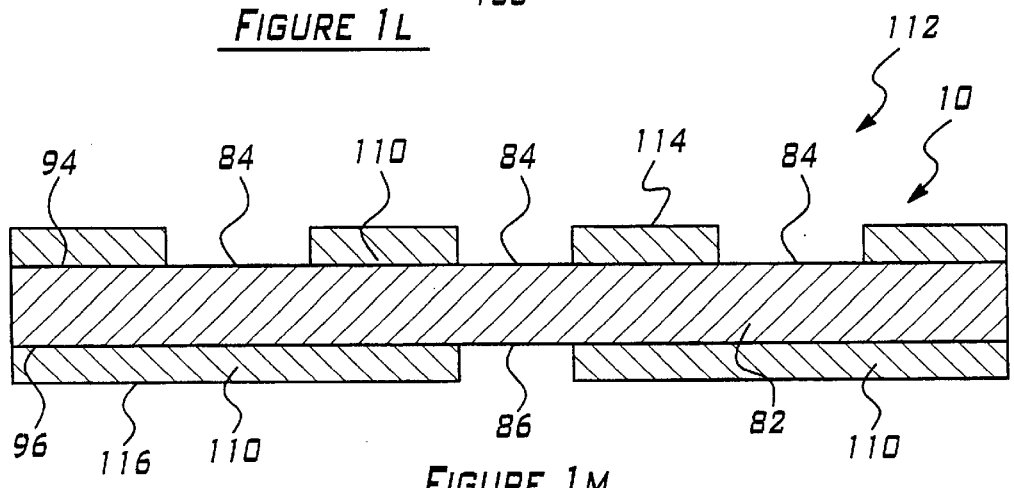
Figure 1N:
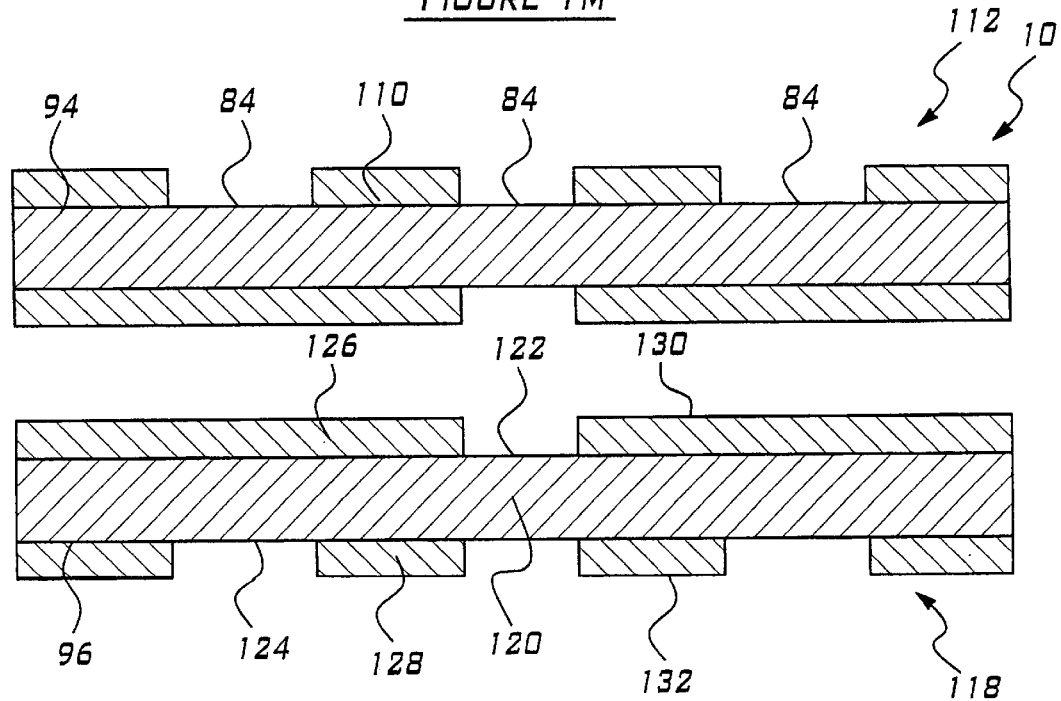
Figure 1O:
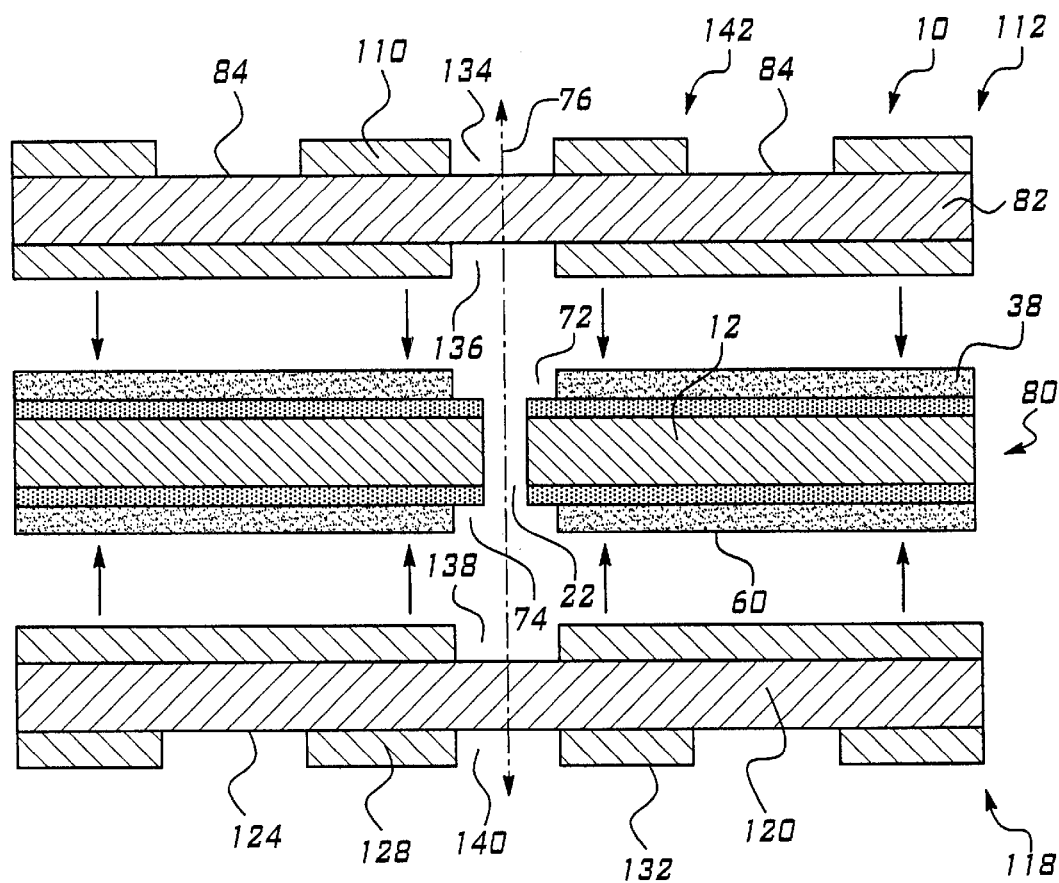
Figure 1P:
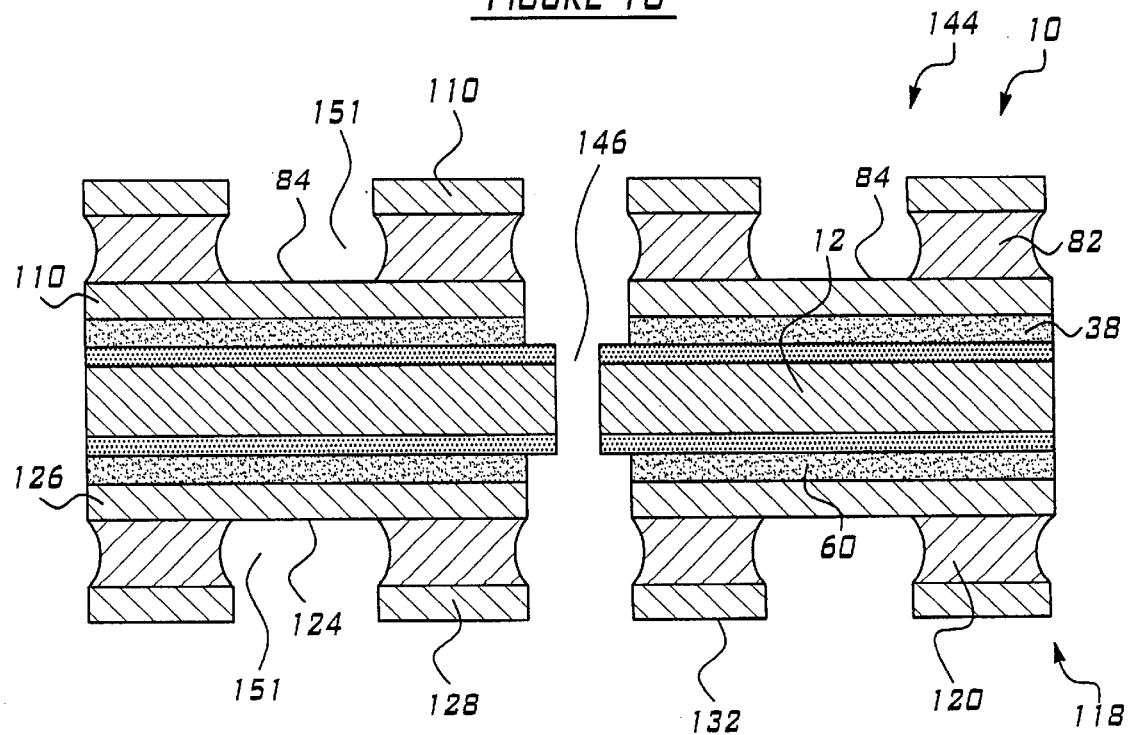
Figure 1Q:
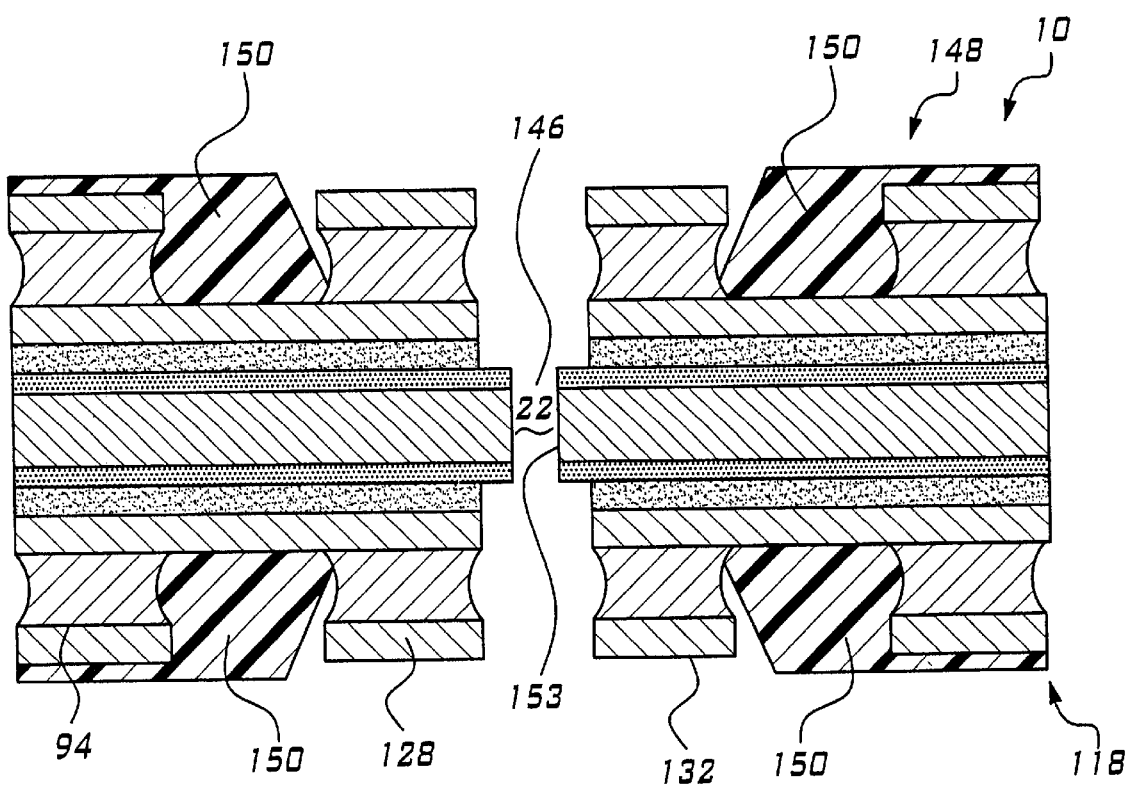

Referring now to FIGS. 1(a)–(q), there is shown a method and/or a process 10 for selectively forming a multi-layer electrical circuit board in accordance with the teachings of the preferred embodiment of the invention. Specifically, as shown best in FIG. 1(a), the circuit board formation or creation process 10 begins with the acquisition and/or creation of a foil member or a core member 12 having a first or "top" surface 14 and a second or "bottom" surface 16. In one non-limiting embodiment of the invention, member 12 is electrically conductive and generally rectangular in shape. In this non-limiting embodiment, core or foil member 12 comprises a copper strip or a metallic/electrically conductive foil.

Process 10 continues by providing a first and a second layer of dielectric material 18, 20 which is selectively applied to member 12. Particularly, layer 18 is selectively connected, coupled, or otherwise attached to the first surface 14 of member 12 and layer 16 is selectively connected, coupled, or otherwise attached to the second surface 16 of member 12. Member 12 and the applied dielectric layers 18, 20 cooperatively form pre-circuit assembly 21. In one non-limiting embodiment of the invention, dielectric material layers 18, 20 comprise a conventional and commercially available epoxy material.

The second step of process 10, as shown best in FIG. 1(b), requires that a hole or aperture 22, having an interior surface 24, be formed within pre-circuit assembly 21, thereby forming pre-circuit assembly 30 having a first or "top" surface 26 and a second or "bottom" surface 28. In one non-limiting embodiment, aperture 22 may be formed by drilling (i.e., mechanical drilling and/or laser drilling), punching, or stamping pre-circuit assembly 21 in a known and conventional manner.

The third step of process 10, as shown best in FIG. 1(c), requires that a layer or foil member 32 be acquired and/or formed having a first or "top" surface 34 and a second or "bottom" surface 36. In one non-limiting embodiment of the invention, member 32 comprises a conventional and commercially available aluminum foil member.

A certain layer of adhesive material 38, having a first or "top" surface 40 and a second or "bottom" surface 42, is applied upon, coupled, or otherwise connected to member 32. Particularly, adhesive material 38 is applied upon surface 36 of member 32, thereby allowing surfaces 36, 40 to abuttingly engage. In a non-limiting embodiment of the invention, adhesive material 38 comprises a conventional and commercially available "z-flex" type of adhesive material.

A layer of "liner" material 44, having a first or "top" surface 46 and a second or "bottom" surface 48, is applied to the layer of adhesive material 38, which is effective to cover, overlay, or substantially "line" the adhesive material 38. Particularly, material 44 is applied upon surface 42 of material 38, effective to cause surfaces 42, 46 to abuttingly engage. In one non-limiting embodiment of the invention, material 44 comprises a conventional and commercially available polyester or "PET" material. In a further non-limiting embodiment, material 44 may be treated with a certain substance or material, such as and without limitation silicone, commercially available Teflon®, or wax. Member 32, and material layers 38, 44 cooperatively form a pre-circuit assembly 50.

The fourth step of process 10, a shown best in FIG. 1(d), requires forming a pre-circuit assembly 52 which is substantially identical to pre-circuit assembly 50. Particularly, pre-circuit assembly 52 comprises a foil member 54 having a first or "top" surface 58 and a second or "bottom" surface 56. In one non-limiting embodiment, member 54 comprises a conventional and commercially available aluminum foil material and may be substantially similar or identical to member 32.

Pre-circuit assembly 52 further comprises a layer of a certain adhesive material 60, having a first or "top" surface 64 and a second or "bottom" surface 62. As shown in FIG. 1(d), adhesive material 60 is attached, connected, or otherwise coupled to member 54 by connecting material 60 to surface 58 of member 54, effective to allow surfaces 58, 62 to abuttingly engage. In one non-limiting embodiment, adhesive material 60 comprises a conventional and commercially available "z-flex" adhesive material. In a further non-limiting embodiment, adhesive material 60 is substantially similar or identical to material 38.

As illustrated in FIG. 1(d), "liner" material 66 having a first or "top" surface 68 and a second or "bottom" surface 70 is attached, connected, applied, or otherwise coupled to adhesive material 60. Particularly, material 66 is applied to surface 64 of adhesive material 60, effective to allow material 66 to overlay, cover, or "line" surface 64 and effective to allow surfaces 64, 70 to abuttingly engage. In one non-limiting embodiment of the invention, material 66 comprises a conventional and commercially available polyester or "PET" material. In a further non-limiting embodiment, material 66 is substantially similar or identical to material 44.

The fifth step of process 10, a shown best in FIG. 1(e), requires that pre-circuit assemblies 50, 52 be connected and/or paired, effective to abuttingly connect surfaces 48, 68 of respective and similar material layers 44, 66. Once pre-circuit assemblies 50, 52 are paired and/or connected, an aperture 72 is formed within pre-circuit assembly 50 and an aperture 74 is formed within pre-circuit assembly 52. It should be appreciated that apertures 72, 74 are substantially identical in shape and size and are formed in a conventional "one-step" process. In the preferred embodiment, apertures 72, 74 are formed by drilling (i.e., mechanical drilling and/or laser drilling) the respective pre-circuit assemblies 50, 52, however in other alternate non-limiting embodiments, apertures 72, 74 may be formed by other known and conventional processes and/or methodologies such as punching or stamping.

The sixth step of process 10, as shown best in FIG. 1(f), requires that pre-circuit assemblies 50, 52 be separated from each other. It should be appreciated that the use of "liner" materials 44, 66 allow pre-circuit assemblies 50, 52 to be relatively easily removed from each other after apertures 72, 74 are formed. Process 10 further requires that each layer of material 44, 66 be respectively removed or "stripped" from pre-circuit assemblies 50, 52 in a known and conventional manner.

The seventh step of process 10, as shown best in FIG. 1(g), requires that pre-circuit assemblies 50, 52 be connected, coupled, or otherwise attached to pre-circuit assembly 30, thereby forming pre-circuit assembly 78.

Particularly, adhesive material 38 is connected to dielectric material 18, effective to allow respective surfaces 42, 26 to abuttingly engage. More particularly, adhesive material 60 is connected to dielectric material 20, effective to allow respective surfaces 64, 28 to abuttingly engage. In this manner, aperture 22 communicates with each of the apertures 72 and 74 and is therefore selectively extended within and through the pre-circuit assembly 78. Moreover, pre-circuit assemblies 50, 52 are aligned with pre-circuit assembly 30 in one non-limiting embodiment, such that the axis of symmetry 76 of aperture 22 overlays or forms the axis of symmetry of each of the apertures 72, 74. In a further non-limiting embodiment of the invention, pre-circuit assemblies 50, 52 are connected to pre-circuit assembly 30 by a known vacuum process.

The eighth step of process 10, as shown best in FIG. 1(h), requires that a certain etchant material (i.e., an aluminum etchant) be applied to pre-circuit assembly 78, effective to remove or "etch away" members 32, 54, thereby forming pre-circuit assembly 80.

The ninth step of process 10, a shown best in FIG. 1(i), begins with the acquisition or formation of a member or foil layer 82 having a first or "top" surface 84 and second or "bottom" surface 86. In one non-limiting embodiment of the invention, member 82 comprises a conventional and commercially available aluminum foil material. A certain electrically conductive material 88 is applied upon surface 84 of member 82 and a certain electrically conductive material 90 is applied upon surface 86 of member 82, thereby forming pre-circuit assembly 92 having a first or "top" surface 94 and a second or "bottom" surface 96. In one non-limiting embodiment of the invention electrically conductive materials 88, 90 are substantially similar or identical and comprise a conventional copper material which is applied or deposited upon member 82 in a known and conventional manner.

The tenth step of process 10, as shown best in FIG. 1(j), requires that a certain photoresistive material 98 be applied upon surface 94 of pre-circuit assembly 92 and a similar certain photoresistive material 100 be applied upon surface 96 of pre-circuit assembly 92, effective to form pre-circuit assembly 102 having a first or "top" surface 104 and a second or "bottom" surface 106. In one non-limiting embodiment of the invention, material layers 88, 90 are processed in a manner which respectively enhances the adhesion of the substantially similar photoresistive materials 98, 100 to each to the respective layers 88, 90. In a further non-limiting embodiment, photoresistive materials 98, 100 each comprise a conventional and commercially available "dry film" which is applied by use of a conventional "hot roll" laminating process.

The eleventh step of process 10, as shown best in FIG. 1(k), requires that the photoresistive materials 98, 100 be processed in a known and conventional manner, thereby allowing certain portions of materials 98, 100 to respectively remain connected to and disposed upon surfaces 94, 96, while other portions of the materials 98, 100 are selectively removed, effective to allow certain portions of surfaces 94, 96 to be exposed, thereby forming pre-circuit assembly 108. In one non-limiting embodiment of the invention, photoresistive materials 98, 100 are selectively "exposed" and "developed" in a known and conventional manner, effective to remove certain portions of materials 98, 100.

The twelfth step of process 10, as shown best by FIG. 1(l), requires that a certain electrically conductive material 110 be selectively applied to pre-circuit assembly 108, effective to overlay and be operatively disposed upon those areas or portions of surfaces 94, 96 which are not respectively covered by the remaining portions of material 98, 100 and having substantially the same height as the remaining material 98, 100, thereby forming pre-circuit assembly 111. In one non-limiting embodiment of the invention, those portions of surfaces 94, 96 which are exposed before material 110 is applied are processed in a known manner, such as by using a "light" conventional etching process, effective to "reactivate" and prepare the copper materials 88, 90 for reception of material 110.

The thirteenth step of process 10, as shown best in FIG. 1(m), requires that the photoresistive material 98, 100 be "stripped" or removed from pre-circuit assembly 111 in a known an conventional manner, effective to selectively expose certain portions of electrically conductive material 88, 90. Those portions of electrically conductive material 88, 90 which resided beneath the removed photoresistive material 98, 100 are then subjected to a certain etchant (i.e., a copper etchant), effective to selectively remove those certain portions of electrically conductive materials 98, 100 and to selectively expose certain portions of surfaces 84, 86 of member 82, thereby forming pre-circuit assembly 112 having a top surface 114, and a bottom surface 116.

The fourteenth step of process 10, as shown best in FIG. 1(n), requires that an additional pre-circuit assembly 118 be formed in substantially the same manner as pre-circuit assembly 112 was formed, which is more fully delineated above. It should be appreciated that pre-circuit assembly 118 is substantially similar to pre-circuit assembly 112. Particularly, pre-circuit assembly 118 contains a foil member 120 having a first or "top" surface 122 and a second or "bottom" surface 124. In one non-limiting embodiment, member 120 is substantially similar or identical to member 82 and comprises a conventional and commercially available aluminum material.

Pre-circuit assembly 118 further includes several electrically conductive members 126, 128 which are substantially similar to members 110 of pre-circuit assembly 112 and which are formed in a manner similar to the manner in which members 110 are formed. In one non-limiting embodiment, electrically conductive members 126, 128 each comprise a conventional and commercially available copper material. It should be appreciated that pre-circuit assembly 118 has first or "top" surface 130 and a second or "bottom" surface 132 which are respectively formed by respective electrically conductive members 126, 128.

The fifteenth step of process 10, as shown best in FIGS. 1(o), requires that pre-circuit assemblies 112 and 118 each be selectively connected to pre-circuit assembly 80, thereby forming pre-circuit assembly 142. Particularly, electrically conductive portions 110 of pre-circuit assembly 112 and electrically conductive portions 126 of pre-circuit assembly 118 are respectively and selectively connected, coupled, or otherwise attached to adhesive materials 38, 60 of pre-circuit assembly 80, effective to allow surfaces 116 and 130 to selectively and respectively abuttingly engage surfaces 40, 62.

Pre-circuit assemblies 112, 118 are aligned with pre-circuit assembly 80, such that axis of symmetry 76 of apertures 22, 72, and 74 overlays and/or substantially forms the axis of symmetry of apertures 134, 136 of pre-circuit assembly 112 and the axis of symmetry of apertures 138, 140 of pre-circuit assembly 118. In a non-limiting embodiment of the invention, pre-circuit assemblies 112, 118 are mechanically aligned with pre-circuit assembly 80.

Particularly, in one non-limiting embodiment, conventional and commercially available "tooling pins" are used to align assemblies 112, 118 with assembly 80 to achieve this desired alignment.

In the sixteenth step of process 10, as shown best in FIG. 1(p), a certain etchant material (i.e., an aluminum etchant) is applied to pre-circuit assemblies 118, 142, effective to remove certain portions of members 82, 120 which are not respectively covered by electrically conductive portions or members 110, 128, thereby forming pre-circuit assembly 144 having an aperture 146 which is cooperatively formed by the apertures 22, 72, 74, 134, 136, 138, and 140 and the selective removal of a certain portion of member 82 contained between aperture 134, 136 and the selective removal of a certain portion of member 120 contained between apertures 138, 140.

The seventeenth step of process 10, as shown best in FIG. 1(q), requires that a certain material 150 be selectively applied upon pre-circuit assembly 144, effective to form a circuit board assembly 148 and to substantially fill the respectively created apertures 151 within members 82, 120. In one non-limiting embodiment of the invention, material 150 comprises a conventional and commercially available solder mask material and is substantially prevented from being applied within aperture 146. In an alternate embodiment of the invention, pre-circuit assembly 80, in the foregoing construction, is replaced by a pre-circuit assembly 150, which is formed by process which is best illustrated in FIGS. 2(a)–(k) and which is more fully described below.

It should be appreciated that aperture 146 forms a "via" which traverses the circuit board assembly 148 and which is effective to produce desired circuit and/or component connections. It should further be appreciated that aperture 146 may be further subjected to known and conventional processes, effective to achieve desired circuit connection strategies (e.g., selective electroplating of the aperture surface 153) in order to cause surface 153 to receive the electrical ground signal which may be placed upon member 12 and causing aperture 146 to be a "grounded via". Alternatively, dielectric material may be placed upon surfaces 153 thereby isolating a selectively disposed component, element, or conductor within aperture 146 from the supplied electrical ground potential and causing aperture 146 to be a "non-grounded via".

Referring now to FIGS. 2(a)–(k), there is shown a circuit board assembly which is produced and/or formed according to the teachings of a second embodiment of the invention. In the second embodiment of the invention, pre-circuit assembly 80, which is more fully delineated above, is replaced by a substantially dissimilar pre-circuit assembly which is formed in accordance with method or process 160. Particularly, process 160 forms a circuit board assembly 248 which may operatively receive and be operatively populated by electrical components and/or elements and which allows for the selective interconnection of the received components and/or elements.

Figure 2A:
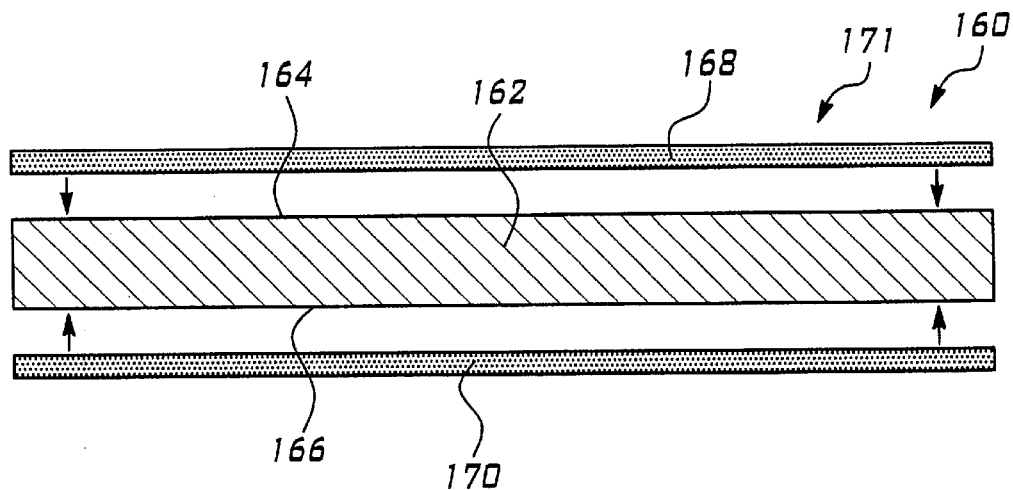
FIGS. 2(a)–(k) are successive sectional side views of a multi-layer circuit board being produced and/or formed in accordance with the teachings of a second embodiment of the invention.

The first step of process 160, as shown in FIG. 2(a), requires the acquisition and/or creation of a foil or core member 162 having a first or "top" surface 164 and a second or "bottom" surface 166. In one non-limiting embodiment of the invention, member 162 is electrically conductive and is generally rectangular in shape. In this non-limiting embodiment, core or foil member 162 comprises a copper strip or a metallic/electrically conductive foil and is substantially similar or identical to member 12.

Process 160 continues by respectively providing a first and second layer of dielectric material 168, 170 which are selectively applied to member 162. Particularly, layer 168 is connected, coupled, or otherwise attached to the first surface 164 of member 162 and layer 170 is connected, coupled, or otherwise attached to the second surface 166 of member 162. Member 162 and dielectric layers 168, 170, cooperatively form pre-circuit assembly 171. In a further non-limiting embodiment, dielectric layers 168, 170 are substantially similar or identical to dielectric layers 18, 20 and comprise a conventional and commercially available epoxy material.

Figure 2B:
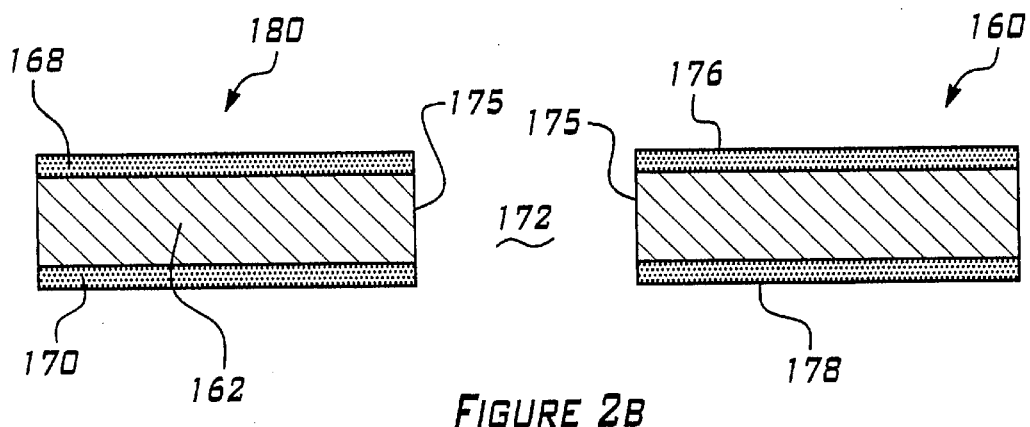

The second step of process 160, as shown best in FIG. 2(b), requires that a hole or aperture 172 be formed within pre-circuit assembly 171 having an interior surface 175, thereby forming pre-circuit assembly 180 having a first or "top" surface 176 and a second or "bottom" surface 178. In one non-limiting embodiment, aperture 172 may be formed by drilling (i.e., mechanical drilling and/or laser drilling), punching, or stamping pre-circuit assembly 171 in a known and conventional manner. It should be appreciated that the aperture 172 is dissimilar to aperture 22 in that, by way of example and without limitation, aperture 172 is wider than aperture 22. Furthermore, in one non-limiting embodiment of the invention, a layer of a certain material, such as a dielectric and/or solder mask material, may be placed upon and/or selectively applied to surface 175 within aperture 172.

Figure 2C:
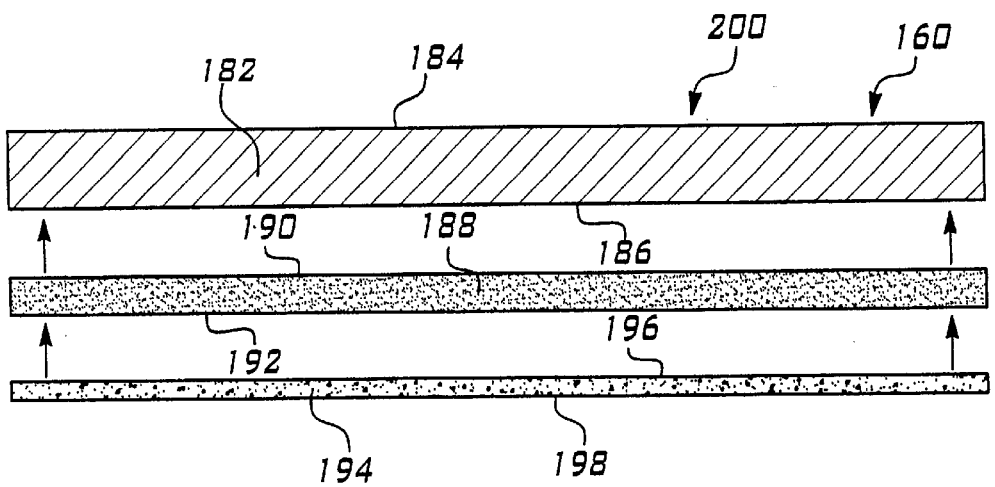

The third step of process 160, as shown best in FIG. 2(c), requires that a material layer or foil member 182 be acquired and/or formed having a first or "top" surface 184 and a second or "bottom" surface 186. In one non-limiting embodiment of the invention, member 182 comprises a conventional and commercially available aluminum foil. In a further non-limiting embodiment of the invention, member 182 is substantially similar or identical to member 32.

A certain layer of adhesive material 188, having a first or "top" surface 190 and a second or "bottom" surface 192, is applied upon, coupled, and/or otherwise connected to member 182. Particularly, adhesive material 188 is applied upon surface 186 of member 182, thereby allowing surfaces 186, 190 to abuttingly engage. In one non-limiting embodiment of the invention, adhesive material 188 comprises a conventional and commercially available "z-flex" type of adhesive material. In a further non-limiting embodiment, material 188 is substantially similar or identical to material 38.

A layer of "lining" material 194, having a first or "top" surface 196 and a second or "bottom" surface 198, is selectively applied to the layer of adhesive material 188, effective to cover, overly, or substantially "line" the adhesive material 188. Particularly, material 194 is applied to layer 188 of adhesive material, effective to allow surfaces 192, 196 to abuttingly engage. In one non-limiting embodiment of the invention, material 194 comprises a conventional and commercially available polyester or "PET" material. Member 182 and material layers 188, 194 cooperatively form a pre-circuit assembly 200.

Figure 2D:
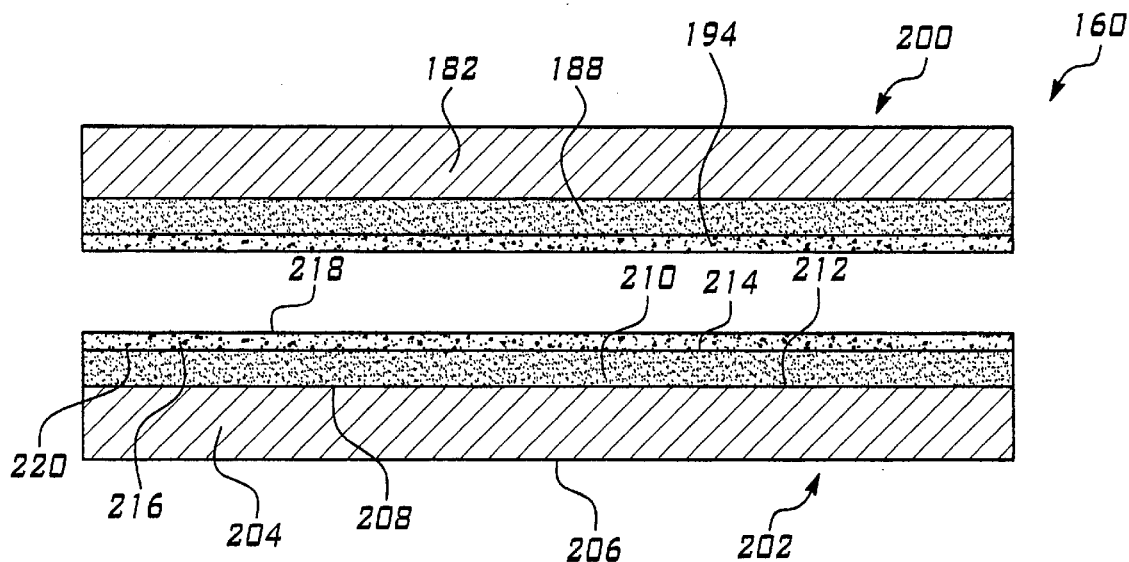

The fourth step of process 160, as shown best in FIG. 2(d), requires forming a pre-circuit assembly 202 which is substantially identical to pre-circuit assembly 200. Particularly, pre-circuit assembly 202 comprises a foil member 204 having a first or "top" surface 208 and a second or "bottom" surface 206. In one non-limiting embodiment, member 204 comprises a conventional and commercially available aluminum foil material. In a further non-limiting embodiment, member 204 is substantially similar or identical to members 32, 54, and 182.

Pre-circuit assembly 202 further comprises a layer of a certain adhesive material 210, having a first or "top" surface 214 and a second or "bottom" surface 212. As illustrated in FIG. 2(d), adhesive material 210 is attached, connected, or otherwise coupled to member 204 by connecting or applying material 210 to surface 208 of member 204, effective to allow surfaces 208, 212 to abuttingly engage. In one non-limiting embodiment, adhesive material 204 comprises a conventional and commercially available "z-flex" type adhesive material. In a further non-limiting embodiment, adhesive material 204 is substantially similar or identical to materials 38, 54, and 188.

As further illustrated in FIG. 2(d), "liner" material 216 having a first or "top" surface 218 and a second or "bottom" surface 220 is attached, connected, applied, or otherwise coupled to adhesive material 210. Particularly, liner material 216 is applied upon surface 214 of adhesive material 210, effective to allow material 216 to overlay, cover, or "line" surface 214 and effective to allow surfaces 214, 220 to abuttingly engage. In one non-limiting embodiment of the invention, material 216 comprises a conventional and commercially available polyester or "PET" material. In a further non-limiting embodiment, material 216 is substantially similar or identical to materials 44, 66, and 194.

Figure 2E:
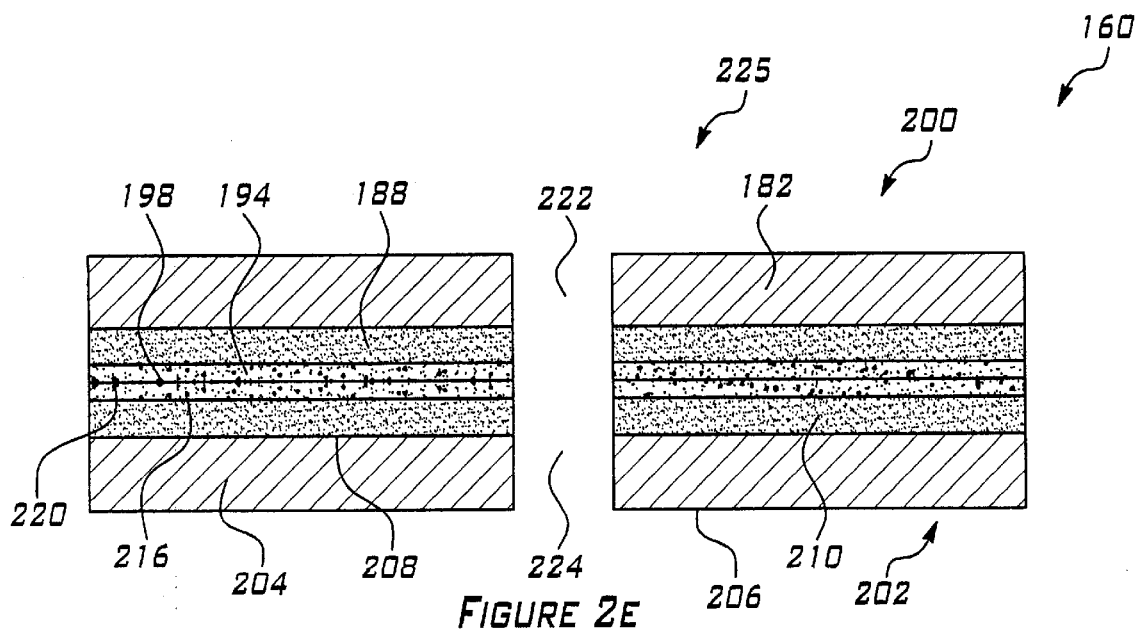

The fifth step of process 160, as shown best in FIG. 2(e), requires that pre-circuit assemblies 200, 202 be paired and/or connected, effective to abuttingly connect surfaces 198, 218 of respective and substantially similar material layers 194, 216. Once pre-circuit assemblies 200, 202 are paired or connected, an aperture 222 is selectively formed within pre-circuit assembly 200 and an aperture 224 is formed within pre-circuit assembly 202, thereby forming a pre-circuit assembly 225. It should be appreciated that apertures 222, 224 are formed by drilling (i.e., mechanical drilling and/or laser drilling) the respective pre-circuit assemblies 200, 202 in a "one-step" process, however in other alternate non-limiting embodiments, apertures 222, 224 may be formed by other known and conventional processes and/or methodologies such as punching or stamping. As shown, apertures 222, 224 communicate and cooperatively form a single aperture through the pre-circuit assembly 225.

Figure 2F:
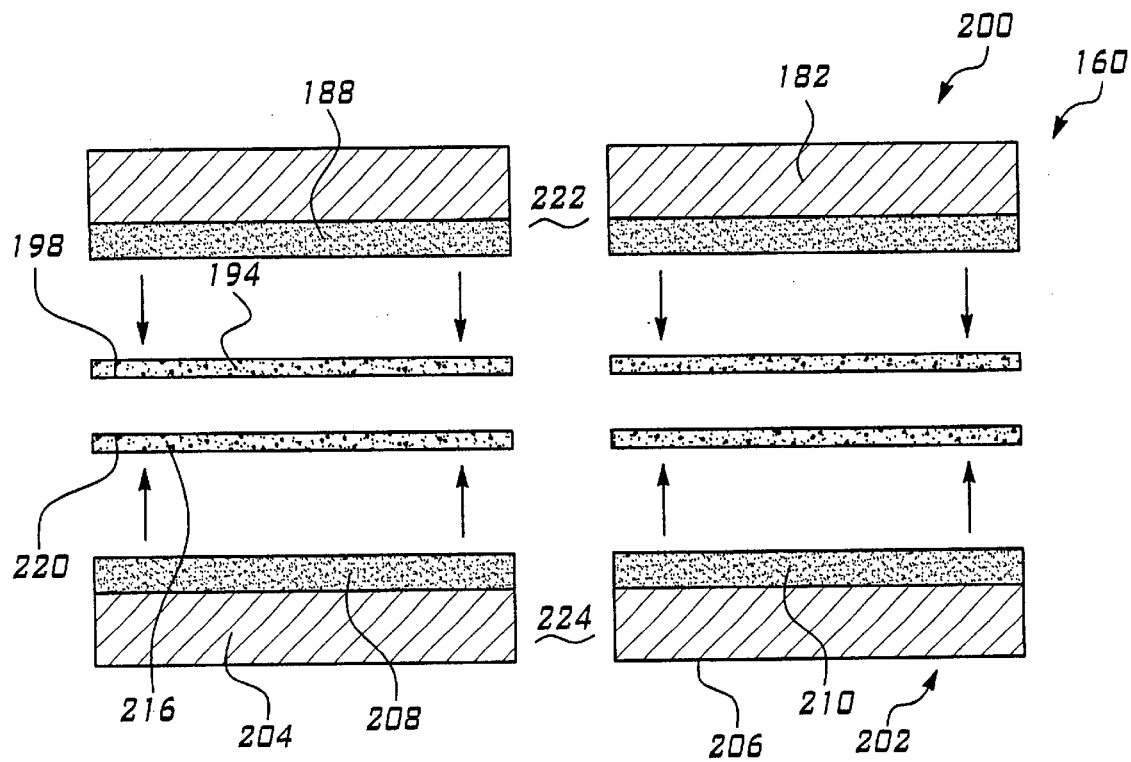

The sixth step of process 160, as shown best in FIG. 2(f), requires that pre-circuit assemblies 200, 202 be separated from one another. It should be appreciated that the use of liner materials 194, 216 allow pre-circuit assemblies 200, 202 to be relatively easily removed from each other after apertures 222, 224 are formed. Process 160 further requires that each layer of material 194, 216 be respectively removed or "stripped" from pre-circuit assemblies 200, 202 in a known and conventional manner.

Figure 2G:
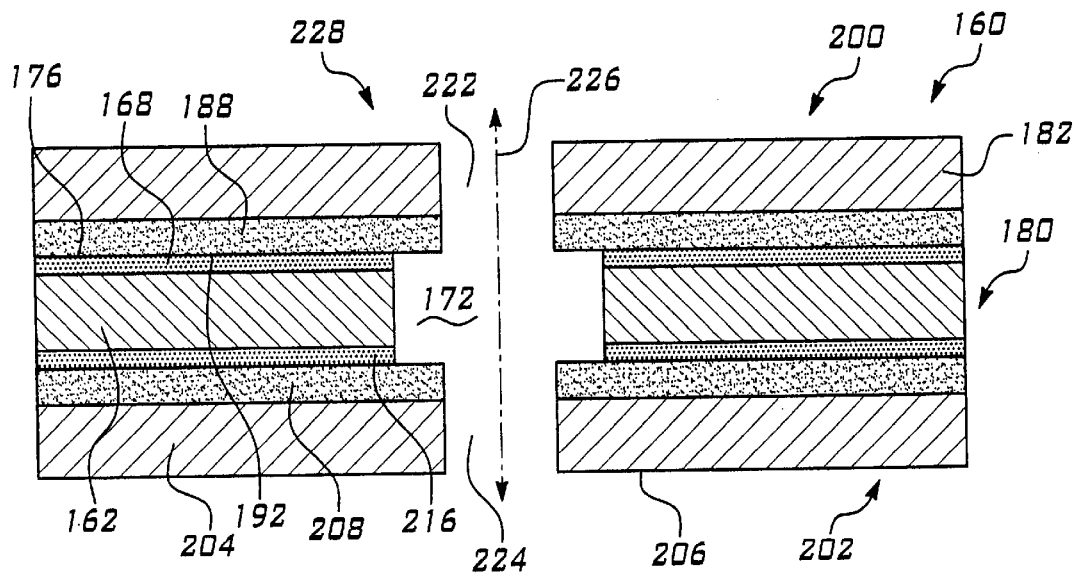

The seventh step of process 160, as shown best in FIG. 2(g), requires that pre-circuit assemblies 200, 202 be connected, coupled, or otherwise attached to pre-circuit assembly 180, thereby forming pre-circuit assembly 228. Particularly, adhesive material 188 is connected to dielectric material 168, effective to allow surfaces 176, 192 to abuttingly engage. Particularly, adhesive material 210 is connected to dielectric material 170, effective to allow surfaces 178, 212 to abuttingly engage. Pre-circuit assemblies 200, 202 are aligned with pre-circuit assembly 180 in such a manner that the axis of symmetry 226 of apertures 222, 224 substantially comprises and/or substantially overlays the axis of symmetry of aperture 172. In a non-limiting embodiment of the invention, pre-circuit assemblies 200, 202 are selectively connected to pre-circuit assembly 180 by a known vacuum process.

Figure 2H:
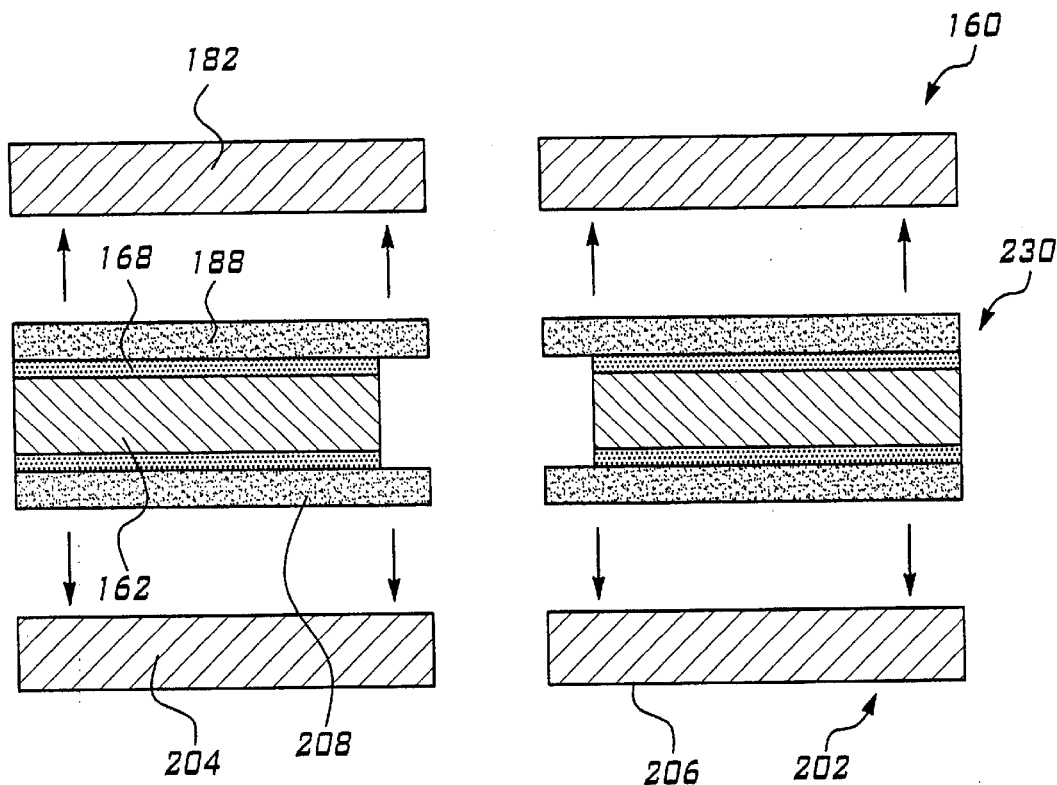

The eighth step of process 160, as shown best in FIG. 2(h), requires that a certain etchant material (i.e., an aluminum etchant) be applied to pre-circuit assembly 228, effective to remove or "etch away" members 182, 204, thereby forming pre-circuit assembly 230. In this alternate embodiment of the invention, pre-circuit assembly 230 replaces pre-circuit assembly 80 which is formed by process and/or method 10 and is processed in a manner which is similar to the manner in which pre-circuit assembly 80 is processed.

Figure 2I:
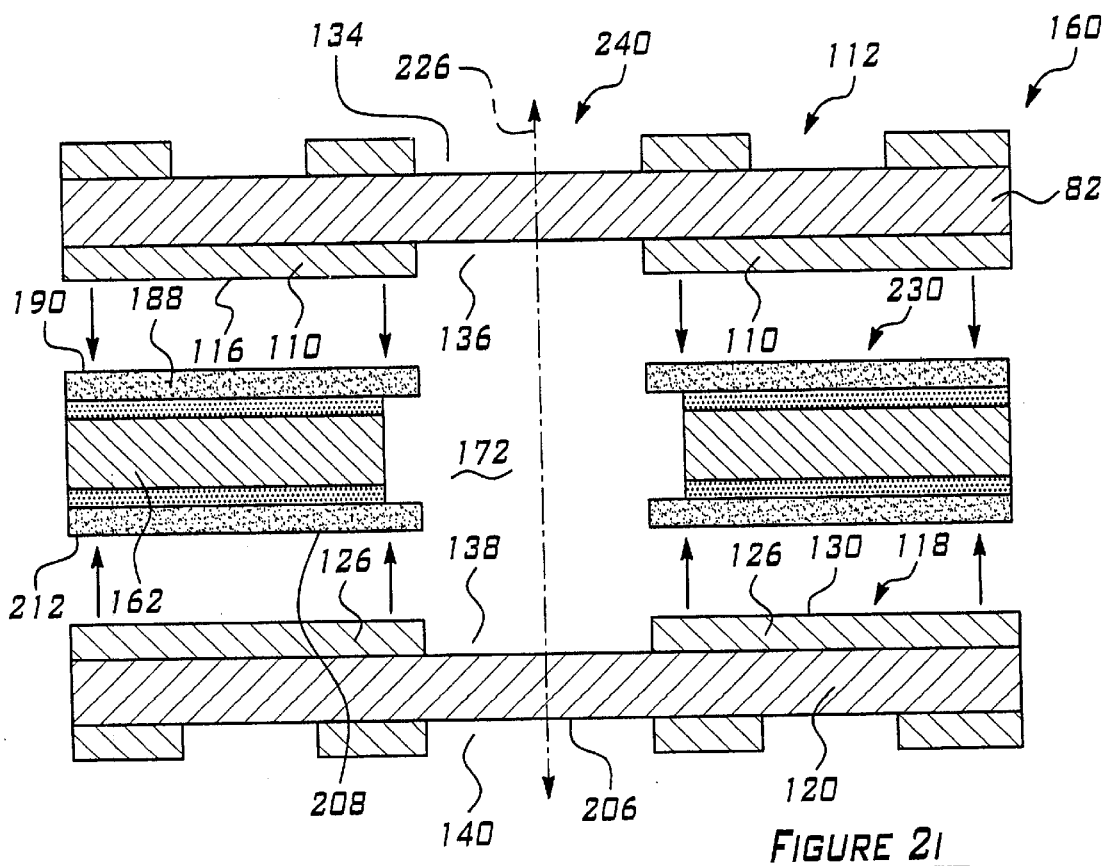

The ninth step of process 160, as shown best in FIG. 2(i), requires that pre-circuit assemblies 112 and 118 be selectively connected to pre-circuit assembly 230, thereby forming pre-circuit assembly 240. Particularly, electrically conductive portions 110 of pre-circuit assembly 112 and electrically conductive portions 126 of pre-circuit assembly 118 are respectively and selectively connected, coupled, or otherwise attached to adhesive materials 188, 208 of pre-circuit assembly 230, effective to allow surfaces 116, 130 to selectively and respectively abut surfaces 190, 212.

Figure 2J:
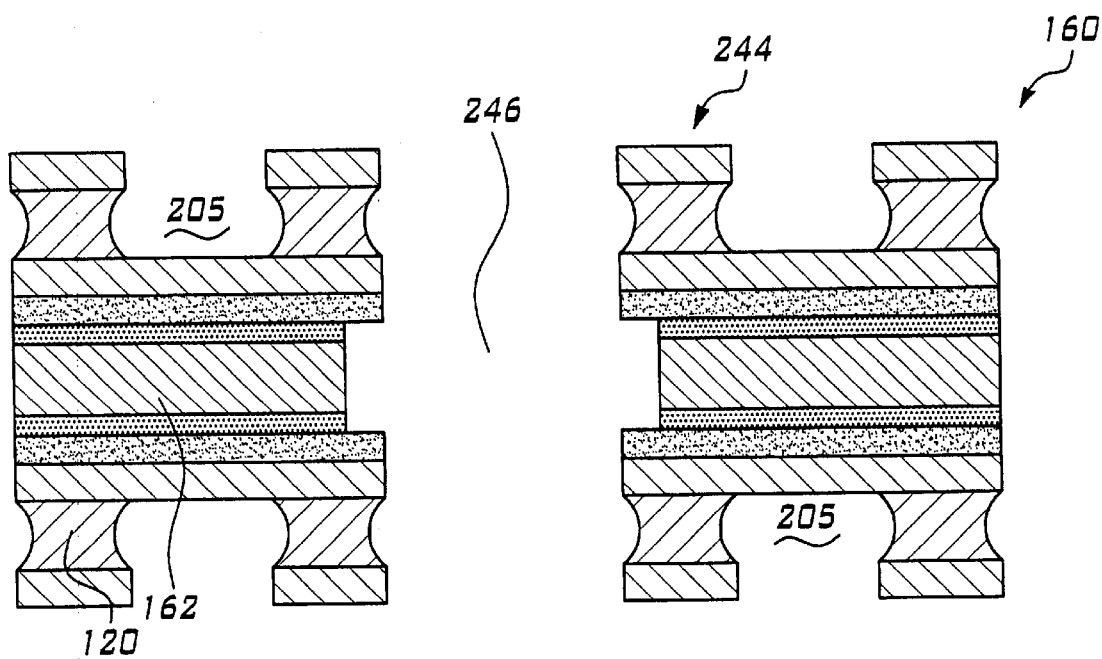
Figure 2K:
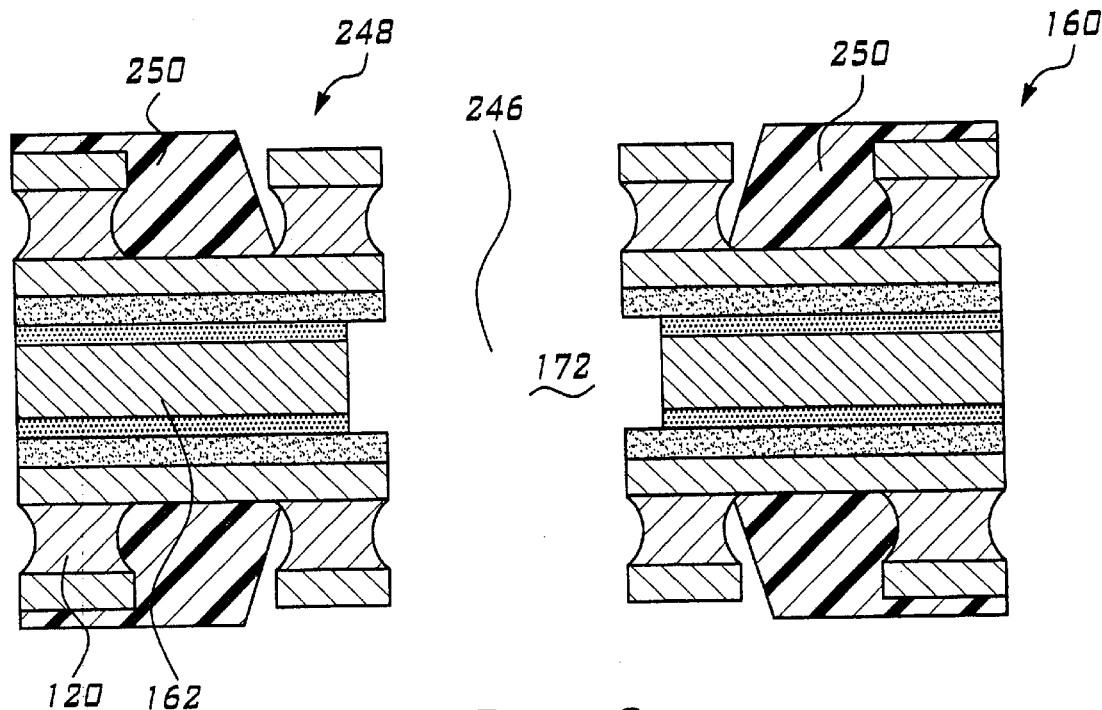

In the eleventh step of process 160, as shown best in FIG. 2(j), a certain etchant material (i.e., an aluminum etchant) is applied to pre-circuit assembly 240, effective to remove certain portions of members 82, 120 which are not respectively covered by electrically conductive portions 110, 128, thereby forming pre-circuit assembly 244, having aperture 246 which is cooperatively formed by the apertures 172, 134, 136, 138, and 140, and the removal of a certain portion of member 82 contained between aperture 134, 136 and the removal of a certain portion of member 120 contained between apertures 138, 140.

The twelfth step of process 160, as shown best in FIG. 2, requires that a certain material 250 be selectively applied upon pre-circuit assembly 244 to substantially fill the aperture 205 within members 82, 120, effective to form pre-circuit assembly 248. In one non-limiting embodiment of the invention, material 250 comprises a conventional and commercially available solder mask material which is selectively applied upon pre-circuit assemblies 112, 118 in such a manner as to prevent any solder mask material 250 from being applied within aperture 246, thereby forming a circuit board or pre-circuit assembly 248.

Pre-circuit assemblies 112, 118 are aligned with pre-circuit assembly 230, such that axis 226 also substantially comprises and/or substantially overlays the axis of symmetry of apertures 134, 136 and apertures 138, 140. In a non-limiting embodiment of the invention, pre-circuit assemblies 112, 118 are mechanically aligned with pre-circuit assembly 230. Particularly, in one non-limiting embodiment, conventional and commercially available "tooling pins" are used to selectively align assemblies 112, 118 with assembly 230.

It should be appreciated that process 10 produces the circuit board and/or pre-circuit assembly 148 which contains pre-circuit assembly 80 which also contains aperture 146 having a relatively narrow central portion 22, while process 160 produces a circuit board and/or pre-circuit assembly 248 which contains an aperture 246 having a relatively wide or "expanded" central portion 172. Apertures 146 and 246 therefore have respective and varying widths which respectively retain selectively disposed and electrically conductive material within the respective apertures 146, 246 by increasing the amount of surface area which the selectively deposited electrically conductive material bonds or adheres to in each respective aperture 146, 246 by forming respective steps within these apertures 146, 246. In one non-limiting embodiment member 162 may be selectively applied/coupled to a source of electrical ground potential, thereby forming a "grounded via".

Figure 3:
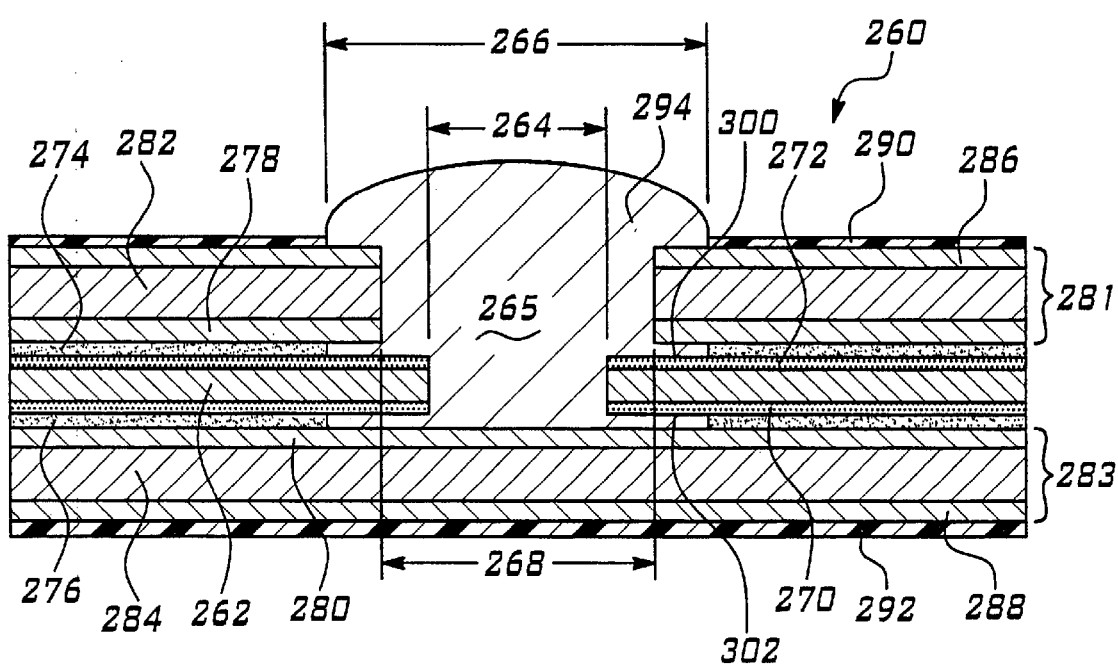
FIG. 3 is a sectional side view of a multi-layer circuit board which is produced and/or formed in accordance with the teachings of a third embodiment of the invention.

Referring now to FIG. 3, there is shown a circuit and/or pre-circuit assembly 260 which is made in accordance with the teachings of a third embodiment of the invention. Particularly, assembly 260 comprises an electrically conductive core metal foil or member 262 which, in one non-limiting embodiment of the invention, comprises a conventional and commercially available copper foil. In a further non-limiting embodiment of the invention, member 262 has a thickness of about one tenth of a millimeter.

Assembly 260 further comprises a pair of substantially similar dielectric layers 270, 272 which overlay unique and opposite longitudinal surfaces of member 262. In one non-limiting embodiment, dielectric layers 270, 272 each have a thickness of about three hundredths of a millimeter. In a further non-limiting embodiment of the invention, dielectric layers 270, 272 each comprise a conventional and commercially available epoxy material. It should be appreciated that selective portions of member 262 and layers 270, 272 are removed from within region 264 which, in one non-limiting embodiment of the invention, comprises a width of about five tenths of a millimeter.

Assembly 260 further comprises a pair of substantially similar adhesive material layers 274, 276 which, in one non-limiting embodiment of the invention, comprise a conventional and commercially available "z-flex" adhesive material. In a further non-limiting embodiment, the thickness of material layers 274, 276 is each about five hundredths of a millimeter. Layers 274, 276 overlay respective layers 272, 270.

Assembly 260 comprises a pair of pre-circuit assemblies 281, 283. Particularly, pre-circuit assembly 281 comprises a foil or core member 282 which is disposed between two electrically conductive members 278, 286. It should be appreciated that a certain portion of members 282, 278, 286 are selectively removed from within area or region 268. In one non-limiting embodiment, region 268 is about seventy-five hundredths of a millimeter. Pre-circuit 283 also comprises a foil or core member 284 which is also disposed between two electrically conductive members 280, 288. Member 278 is coupled to layer 274 while member 280 is coupled to layer 276.

In one non-limiting embodiment of the invention, members 282, 284 each comprise a conventional and commercially available aluminum foil material and electrically conductive members 278, 280, 286, and 288 each comprise a conventional and commercially available copper material. In yet a further non-limiting embodiment of the invention, members 282, 284 each have a thickness of about fifteen hundredths of a millimeter and electrically conductive members 278, 280, 286, and 288 each have a thickness of about five hundredths of a millimeter.

A layer of a certain material 290 is applied to member 286 and a similar layer of a certain material 292 is applied to member 288. In one non-limiting embodiment of the invention, material layers 290, 292 each comprise an acrylic material. In a further non-limiting embodiment of the invention, material layers 290, 292 each have a thickness of about three hundredths of a millimeter. It should be appreciated that portions of electrically conductive members 276, 274 and acrylic material 290 are selectively removed from within region 266. In one non-limiting embodiment of the invention, region 266 has a width of about one millimeter.

Electrically conductive material 294 is selectively placed within the aperture or recess 265 which is cooperatively formed by the previously delineated removal and/or absence of the layers 262, 270, 272, and 278, 282, 286, and 276, 274, 290 from these regions or areas 264, 268, 266. In one non-limiting embodiment of the invention, electrically conductive material 294 comprises a conventional and commercially available solder material. In a further non-limiting embodiment of the invention, material 294 electrically interconnects aperture 265 to member 262 which is connected to a source of electrical ground potential. It should be appreciated that member 270 cooperates with portion 274, 276 to cause aperture 265 to have a relatively wide top portion 320 and a narrow middle portion 322 and to provide steps of recesses 300, 302 within the aperture 265, thereby increasing the amount of surface area for the material 294 to bond or adhere to within the aperture 265.

It should be understood that the invention is not limited to the exact embodiment or construction which has been illustrated and described but that various changes may be made without departing from the spirit and the scope of the invention.

What is claimed is:

1. A method for making a circuit board comprising the steps of:

providing a core member having a first surface and a second surface;

attaching a certain first material upon said first surface and upon said second surface, effective to form a first pre-circuit assembly;

forming a first aperture within said first pre-circuit assembly;

providing a first metal member having a first and a second surface and a second metal member having a first and a second surface;

attaching a certain second material to said second surface of said first metal member and to said first surface of said second metal member;

applying a certain liner material to said certain second material;

engaging said first and second metal members;

forming a second aperture through said engaged first and second metal members, through said certain second material, and through said certain liner material;

separating said engaged first and second metal members;

removing said certain liner material from said certain second material;

selectively attaching said certain second material resident upon said first metal member to said certain first material resident upon said first pre-circuit assembly while causing said second aperture which is formed within said first metal member to communicate with said first aperture;

selectively attaching said certain second material resident upon said second metal member to said certain material resident upon said first pre-circuit assembly while causing said second aperture which is formed within said first metal member to communicate with said first aperture;

selectively removing said certain first and second metal members, effective to form a second pre-circuit assembly;

providing third and fourth pre-circuit assemblies;

attaching said third and fourth pre-circuit assemblies to said second pre-circuit assembly; and removing certain portions of said third and fourth pre-circuit assemblies, effective to form a third and fourth aperture which respectively communicate with said first and second apertures and which cooperate with said second pre-circuit assembly to form a circuit board having an aperture which extends through the formed circuit board.

2. The method of claim 1 wherein said core member comprises copper.

3. The method of claim 1 wherein said certain first material comprises epoxy.

4. The method of claim 1 wherein said certain second material comprises adhesive.

5. The method of claim 1 wherein said third pre-circuit assembly is formed by the process of:

providing a member having a first surface and a second surface;

applying a first electrically conductive material to said first surface and to said second surface of said member;

selectively applying a photoresist material upon said certain portions of electrically conductive material;

selectively removing certain portions of said first electrically conductive material, thereby exposing at least one portion of said first surface;

applying a second electrically conductive material to said at least one portion of said first surface; and removing said photo resistive material, thereby forming a pre-circuit assembly.

6. The method of claim 1 wherein said second, third, and fourth apertures are substantially wider than said first aperture.

7. The method of claim 1 further comprising the step of placing electrically conductive material within said first, second, and third apertures.

8. A method for making a circuit board comprising the steps of:

providing a first electrically conductive member having a first and a second surface;

providing a second member having a first and a second surface;

placing a dielectric material upon said first and second surface of said first electrically conductive member;

forming a first aperture within said first electrically conductive member;

placing an adhesive material upon said first surface of said second member;

placing a liner material upon said adhesive material;

providing a third member upon which a layer of said adhesive material is disposed;

placing a layer of said liner material upon said adhesive material disposed upon said third member;

attaching said layer of said liner material which is disposed upon said second member to said layer of said liner material which is disposed upon said third member;

forming an aperture within said second and third members and within said adhesive material respectively disposed upon said second and third members;

separating said attached layers of liner materials;

removing said layers of said liner material;

coupling said adhesive material which is resident upon said first surface of said second member to said dielectric material which is resident upon said first surface of said first electrically conductive member and coupling said adhesive material which is resident upon said second surface of said second member to said dielectric material which is resident upon said second surface of said first electrically conductive member while allowing said first aperture to communicate with said aperture formed within each of said second and third members and within said adhesive material respectively disposed upon said second and third members;

removing said second and third members;

providing a first pre-circuit assembly having a fourth member upon which a fifth member is disposed;

providing a second pre-circuit assembly having a sixth member upon which a seventh member is disposed;

coupling said fifth member to a first portion of said adhesive material;

coupling said seventh member to a second portion of said adhesive material; and removing portions of said fourth and sixth members, thereby forming a circuit board assembly and extending said first aperture through said formed circuit board assembly.

9. The method of claim 8 further comprising the step of placing electrically conductive material within said first aperture.

10. The method of claim 8 wherein said step of removing portions of said sixth member comprises the step of etching said sixth member.

11. The method of claim 10 wherein said step of etching said sixth member causes apertures to be created within said sixth member, said method further comprising the step of substantially filling said apertures with a certain material.

12. The method of claim 10 wherein said extended first aperture has a varying width.

* * * * *